(12) United States Patent
Wyse

(10) Patent No.: US 10,879,859 B1
(45) Date of Patent: Dec. 29, 2020

(54) DIFFERENTIAL POWER AMPLIFIER

(71) Applicant: Rockwell Collins, Inc., Cedar Rapids, IA (US)

(72) Inventor: Russell D. Wyse, Center Point, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 3 days.

(21) Appl. No.: 16/130,328

(22) Filed: Sep. 13, 2018

(51) Int. Cl.
*H03F 3/45* (2006.01)
*H03F 3/24* (2006.01)
*H03F 1/32* (2006.01)

(52) U.S. Cl.
CPC ....... *H03F 3/45098* (2013.01); *H03F 1/3211* (2013.01); *H03F 3/245* (2013.01); *H03F 3/45125* (2013.01); *H03F 2200/451* (2013.01)

(58) Field of Classification Search
CPC .... H03F 3/45098; H03F 3/245; H03F 1/3211; H03F 3/45125; H03F 2200/451
USPC .................................................. 330/252–254
See application file for complete search history.

(56) References Cited

U.S. PATENT DOCUMENTS

| 5,619,169 | A | * | 4/1997 | Matsuura | ............. | H03G 1/0023 330/254 |
| 8,660,514 | B1 | * | 2/2014 | Wyse | ................... | H03F 1/3211 327/356 |
| 8,890,617 | B2 | * | 11/2014 | Marra | ..................... | H03F 3/189 330/285 |
| 2011/0181359 | A1 | * | 7/2011 | Balboni | ................ | H03F 1/3211 330/261 |

\* cited by examiner

*Primary Examiner* — Khanh V Nguyen
*Assistant Examiner* — Khiem D Nguyen
(74) *Attorney, Agent, or Firm* — Suiter Swantz pc llo

(57) ABSTRACT

A differential power amplifier (DPA) includes an p-side and a n-side half circuit. The p-side and n-side half circuits include an p-side and n-side base, which receive respective in-phase and out-of-phase signals of a differential signal. The DPA includes an p-side biasing circuit and a n-side biasing circuit. The p-side and n-side biasing circuit are configured to provide a controllable p-side and n-side biasing signal to the p-side and n-side base, respectively. The DPA includes a power source which provides positive DC voltage to the controller of the p-side and n-side half circuits. The DPA includes supply and grounding circuit structure which provides common mode DC paths and balances the n-side and p-side half circuits to provide a radio frequency (RF) virtual ground to an emitter of the n-side half circuit and p-side half circuit.

20 Claims, 12 Drawing Sheets

1.3V InP Differential PA Fixed Topology - 50 GHz
45.1% PAE at 15.4dBm

| Prf1 | PdcPA | PoutPA_dBm | Pgain | Peff | Pae | PoutPA |
|---|---|---|---|---|---|---|
| -10.000 | 0.079 | 3.936 | 13.936 | 3.120 | 2.994 | 0.002 |
| -9.000 | 0.079 | 4.901 | 13.901 | 3.896 | 3.737 | 0.003 |
| -8.000 | 0.079 | 5.852 | 13.852 | 4.849 | 4.649 | 0.004 |
| -7.000 | 0.079 | 6.785 | 13.785 | 6.011 | 5.759 | 0.005 |
| -6.000 | 0.079 | 7.696 | 13.696 | 7.414 | 7.097 | 0.006 |
| -5.000 | 0.079 | 8.580 | 13.580 | 9.087 | 8.689 | 0.007 |
| -4.000 | 0.079 | 9.428 | 13.428 | 11.053 | 10.551 | 0.009 |
| -3.000 | 0.079 | 10.233 | 13.233 | 13.318 | 12.695 | 0.011 |
| -2.000 | 0.079 | 10.985 | 12.995 | 15.872 | 15.073 | 0.013 |
| -1.000 | 0.079 | 11.679 | 12.679 | 18.693 | 17.695 | 0.015 |
| 0.000 | 0.078 | 12.311 | 12.311 | 21.767 | 20.488 | 0.017 |
| 1.000 | 0.077 | 12.884 | 11.884 | 25.099 | 23.472 | 0.019 |
| 2.000 | 0.076 | 13.401 | 11.401 | 28.732 | 26.651 | 0.022 |
| 3.000 | 0.074 | 13.868 | 10.868 | 32.744 | 30.063 | 0.024 |
| 4.000 | 0.072 | 14.288 | 12.288 | 37.233 | 33.743 | 0.027 |
| 5.000 | 0.069 | 14.659 | 9.669 | 42.230 | 37.662 | 0.029 |
| 6.000 | 0.066 | 14.971 | 8.971 | 47.500 | 41.480 | 0.031 |
| 7.000 | 0.064 | 15.201 | 8.201 | 52.138 | 44.247 | 0.033 |
| 8.000 | 0.062 | 15.350 | 7.350 | 55.320 | 45.137 | 0.034 |
| 9.000 | 0.061 | 15.452 | 6.452 | 57.485 | 44.472 | 0.035 |
| 10.000 | 0.060 | 15.527 | 5.527 | 59.128 | 42.588 | 0.035 |

FIG. 5
(CONT'D)

2V InP Differential PA Fixed Topology - 50 GHz
Switched in Parallel L)
49.5% PAE at 18.8dBm

| Prf1 | PdcPA | PoutPA_dBm | Pgain | Peff | Pae | PoutPA |
|---|---|---|---|---|---|---|
| -8.000 | 0.172 | 7.346 | 15.346 | 3.160 | 3.068 | 0.005 |
| -7.000 | 0.172 | 8.317 | 15.317 | 3.952 | 3.835 | 0.007 |
| -6.000 | 0.172 | 9.281 | 15.281 | 4.933 | 4.787 | 0.008 |
| -5.000 | 0.172 | 10.236 | 15.236 | 6.146 | 5.962 | 0.011 |
| -4.000 | 0.172 | 11.178 | 15.178 | 7.636 | 7.405 | 0.013 |
| -3.000 | 0.172 | 12.100 | 15.100 | 9.445 | 9.154 | 0.016 |
| -2.000 | 0.172 | 12.985 | 14.985 | 11.588 | 11.220 | 0.020 |
| -1.000 | 0.171 | 13.817 | 14.817 | 14.050 | 13.587 | 0.024 |
| 0.000 | 0.171 | 14.586 | 14.586 | 16.809 | 16.224 | 0.029 |
| 1.000 | 0.170 | 15.287 | 14.287 | 19.836 | 19.097 | 0.034 |
| 2.000 | 0.069 | 15.921 | 13.921 | 23.111 | 22.174 | 0.039 |
| 3.000 | 0.067 | 16.492 | 13.492 | 26.640 | 25.448 | 0.045 |
| 4.000 | 0.065 | 17.005 | 13.005 | 30.476 | 28.950 | 0.050 |
| 5.000 | 0.061 | 17.465 | 12.465 | 34.720 | 32.752 | 0.056 |
| 6.000 | 0.055 | 17.876 | 11.876 | 39.527 | 36.960 | 0.061 |
| 7.000 | 0.048 | 18.232 | 11.232 | 44.989 | 41.602 | 0.067 |
| 8.000 | 0.140 | 18.511 | 10.511 | 50.544 | 46.050 | 0.071 |
| 9.000 | 0.135 | 18.681 | 9.681 | 54.565 | 48.692 | 0.074 |
| 10.000 | 0.132 | 18.775 | 8.775 | 57.075 | 49.507 | 0.075 |
| 11.000 | 0.130 | 18.818 | 7.818 | 58.787 | 49.072 | 0.076 |
| 12.000 | 0.127 | 18.820 | 6.820 | 59.954 | 47.485 | 0.076 |

FIG. 6
(CONT'D)

3V InP Differential PA Fixed Topology - 50 GHz
(Switched in Parallel L)
48.5% PAE at 21.4dBm

| Prf1 | PdcPA | PoutPA_dBm | Pgain | Peff | Pae | PoutPA |
|---|---|---|---|---|---|---|
| -8.000 | 0.315 | 8.207 | 16.207 | 2.098 | 2.048 | 0.007 |
| -7.000 | 0.315 | 9.174 | 16.174 | 2.621 | 2.558 | 0.008 |
| -6.000 | 0.315 | 10.133 | 16.133 | 3.270 | 3.190 | 0.010 |
| -5.000 | 0.315 | 11.084 | 16.084 | 4.070 | 3.970 | 0.013 |
| -4.000 | 0.315 | 12.025 | 16.025 | 5.055 | 4.929 | 0.016 |
| -3.000 | 0.315 | 12.954 | 15.954 | 6.262 | 6.103 | 0.020 |
| -2.000 | 0.315 | 13.870 | 15.870 | 7.734 | 7.534 | 0.024 |
| -1.000 | 0.315 | 14.771 | 15.771 | 9.520 | 9.268 | 0.030 |
| 0.000 | 0.315 | 15.655 | 15.655 | 11.673 | 11.356 | 0.037 |
| 1.000 | 0.315 | 16.518 | 15.518 | 14.250 | 13.851 | 0.045 |
| 2.000 | 0.314 | 17.353 | 15.353 | 17.294 | 16.790 | 0.054 |
| 3.000 | 0.313 | 18.133 | 15.133 | 20.755 | 20.118 | 0.065 |
| 4.000 | 0.312 | 18.834 | 14.834 | 24.511 | 23.705 | 0.076 |
| 5.000 | 0.309 | 19.456 | 14.456 | 28.542 | 27.519 | 0.088 |
| 6.000 | 0.305 | 20.007 | 14.007 | 32.882 | 31.575 | 0.100 |
| 7.000 | 0.298 | 20.491 | 13.491 | 37.595 | 35.913 | 0.112 |
| 8.000 | 0.288 | 20.903 | 12.903 | 42.685 | 40.497 | 0.123 |
| 9.000 | 0.278 | 21.216 | 12.216 | 47.599 | 44.741 | 0.132 |
| 10.000 | 0.270 | 21.392 | 11.392 | 51.103 | 47.395 | 0.138 |
| 11.000 | 0.262 | 21.446 | 10.446 | 53.299 | 48.490 | 0.140 |
| 12.000 | 0.254 | 21.419 | 9.419 | 54.581 | 48.341 | 0.139 |

FIG. 7
(CONT'D)

4V InP Differential PA Fixed Topology - 50 GHz
(Switched in Parallel L)
45.5% PAE at 23.1dBm

| Prf1 | PdcPA | PoutPA_dBm | Pgain | Peff | Pae | PoutPA |
|---|---|---|---|---|---|---|
| -6.000 | 0.499 | 10.679 | 16.679 | 2.344 | 2.293 | 0.012 |
| -5.000 | 0.499 | 11.622 | 16.622 | 2.912 | 2.849 | 0.015 |
| -4.000 | 0.499 | 12.553 | 16.553 | 3.610 | 3.530 | 0.018 |
| -3.000 | 0.498 | 13.471 | 16.471 | 4.462 | 4.362 | 0.022 |
| -2.000 | 0.498 | 14.376 | 16.376 | 5.499 | 5.373 | 0.027 |
| -1.000 | 0.498 | 15.266 | 16.266 | 6.755 | 6.595 | 0.034 |
| 0.000 | 0.497 | 16.139 | 16.139 | 8.267 | 8.066 | 0.041 |
| 1.000 | 0.497 | 16.995 | 15.995 | 10.082 | 9.828 | 0.050 |
| 2.000 | 0.496 | 17.833 | 15.833 | 12.247 | 11.928 | 0.061 |
| 3.000 | 0.495 | 18.651 | 15.651 | 14.819 | 14.415 | 0.073 |
| 4.000 | 0.493 | 19.447 | 15.447 | 17.855 | 17.346 | 0.088 |
| 5.000 | 0.491 | 20.216 | 15.216 | 21.409 | 20.765 | 0.105 |
| 6.000 | 0.487 | 20.938 | 14.938 | 25.466 | 24.650 | 0.124 |
| 7.000 | 0.481 | 21.579 | 14.579 | 29.883 | 28.842 | 0.144 |
| 8.000 | 0.472 | 22.134 | 14.134 | 34.640 | 33.303 | 0.163 |
| 9.000 | 0.459 | 22.599 | 13.599 | 39.674 | 37.941 | 0.182 |
| 10.000 | 0.445 | 22.939 | 12.939 | 44.208 | 41.961 | 0.197 |
| 11.000 | 0.434 | 23.123 | 12.123 | 47.331 | 44.428 | 0.205 |
| 12.000 | 0.420 | 23.159 | 11.159 | 49.256 | 45.484 | 0.207 |
| 13.000 | 0.406 | 23.098 | 10.098 | 50.276 | 45.361 | 0.204 |
| 14.000 | 0.392 | 22.994 | 8.994 | 50.816 | 44.410 | 0.199 |

FIG. 8
(CONT'D)

DIFFERENTIAL POWER AMPLIFIER

BACKGROUND

Embodiments of the inventive concepts disclosed herein relate generally to the field of power amplifiers. More particularly, embodiments of the inventive concepts disclosed herein relate to systems and methods for wideband differential power amplifiers.

Most radio systems and antennas are single ended (e.g., use or employ single ended signals) and digital/analog converters (DAC's and ADC's) are differential (e.g., use or employ differential signals). Digital (or analog) signals are manipulated and converted to an electromagnetic signal according to the single-ended configuration of the antenna. In forcing an absolute common ground for RF components, such as power amplifiers in single ended systems, such radio systems and antennas may have frequency limitations due to difficulty in maintaining the absolute common ground at high frequencies.

SUMMARY

In one aspect, the inventive concepts disclosed herein are directed to a differential power amplifier. The differential power amplifier includes a p-side half circuit having a p-side base configured to receive an in-phase signal of a differential input signal. The differential power amplifier includes an n-side half circuit having an n-side base configured to receive an out-of-phase signal of the differential input signal. The differential power amplifier includes a p-side biasing circuit configured to provide a controllable p-side biasing signal to the p-side base. The differential power amplifier includes an n-side biasing circuit configured to provide a controllable n-side biasing signal to the n-side base. The n-side biasing circuit and p-side biasing circuit operate independently of one another. The differential power amplifier includes a power source configured to apply a positive direct current (DC) voltage to a collector of the n-side half circuit and a collector of the p-side half circuit of the power amplifier. The differential power amplifier includes supply and grounding circuit structure which provides common mode DC paths for the collector and emitter of the n-side and p-side half circuit to the power source and absolute ground, and balances the n-side and p-side half circuits to provide a radio frequency (RF) virtual ground to the emitter of the n-side half circuit and p-side half circuit.

In a further aspect, the inventive concepts disclosed herein are directed to an antenna system. The antenna system includes a differential antenna. The antenna system also includes a differential power amplifier communicably coupled to the differential antenna. The differential power amplifier provides an amplified differential output signal to the differential antenna, the amplified differential output signal corresponding to a differential input signal. The differential power amplifier includes a p-side half circuit having a p-side base configured to receive an in-phase signal of a differential input signal. The differential power amplifier includes an n-side half circuit having an n-side base configured to receive an out-of-phase signal of the differential input signal. The differential power amplifier includes a p-side biasing circuit configured to provide a controllable p-side biasing signal to the p-side base. The differential power amplifier includes an n-side biasing circuit configured to provide a controllable n-side biasing signal to the n-side base. The n-side biasing circuit and p-side biasing circuit operate independently of one another. The differential power amplifier includes a power source configured to apply a positive direct current (DC) voltage to a collector of the n-side half circuit and a collector of the p-side half circuit of the power amplifier. The differential power amplifier includes supply and grounding circuit structure which provides common mode DC paths for the collector and emitter of the n-side and p-side half circuit to the power source and absolute ground, and balances the n-side and p-side half circuits to provide a radio frequency (RF) virtual ground to the emitter of the n-side half circuit and p-side half circuit.

BRIEF DESCRIPTION OF THE DRAWINGS

Implementations of the inventive concepts disclosed herein may be better understood when consideration is given to the following detailed description thereof. Such description makes reference to the annexed drawings, which are not necessarily to scale, and in which some features may be exaggerated and some features may be omitted or may be represented schematically in the interest of clarity. Like reference numerals in the figures may represent and refer to the same or similar element, feature, or function. In the drawings.

DETAILED DESCRIPTION

Figure 1:
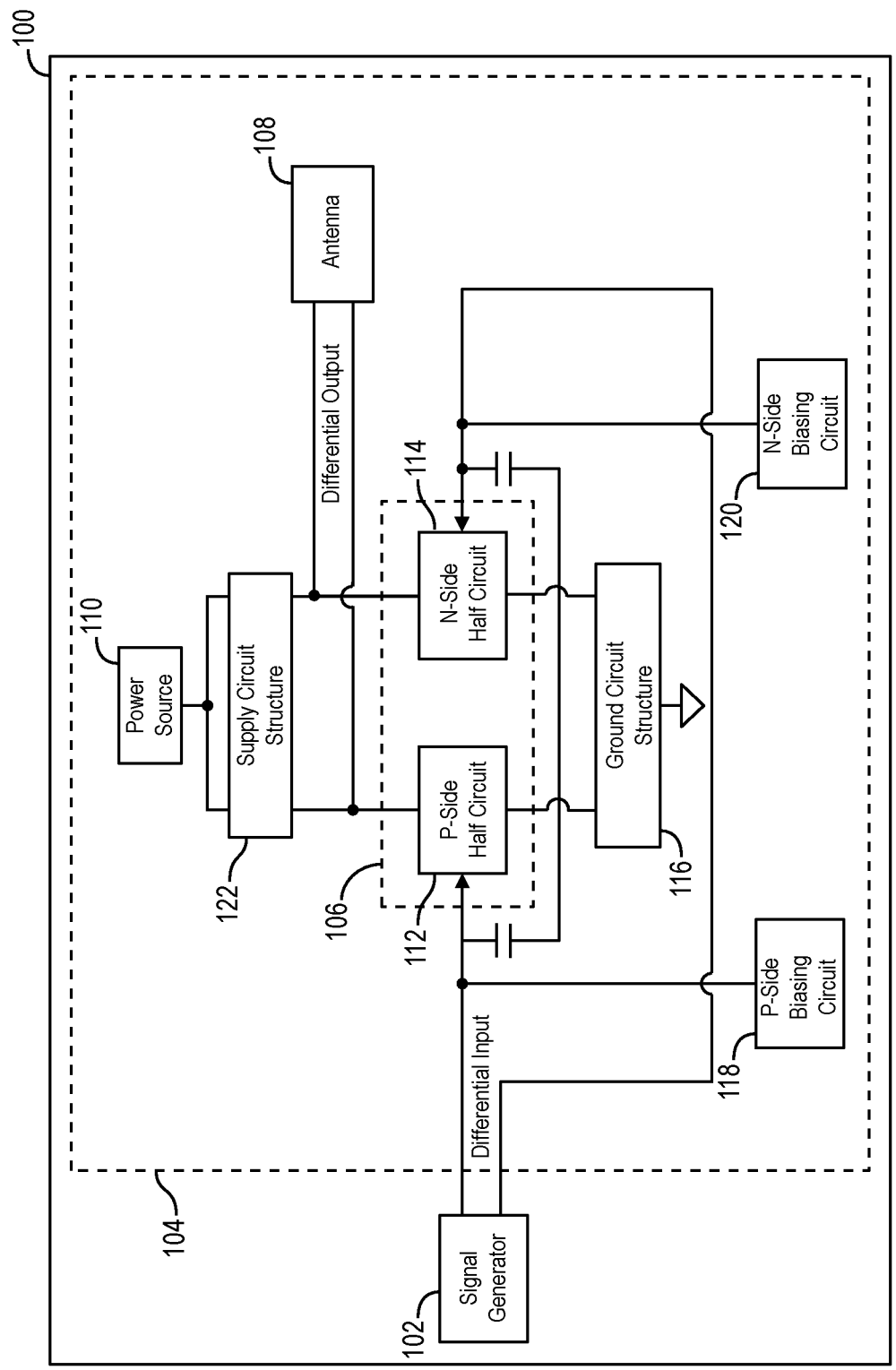
FIG. 1 is a schematic drawing of a radio system, according to exemplary aspects of the inventive concepts disclosed herein.

Before describing in detail the inventive concepts disclosed herein, it should be observed that the inventive concepts disclosed herein include, but are not limited to, a novel structural combination of data/signal processing components, sensors, and/or communications circuits, and not in the particular detailed configurations thereof. Accordingly, the structure, methods, functions, control and arrangement of components, software, and circuits have, for the most part, been illustrated in the drawings by readily understandable block representations and schematic diagrams, in order not to obscure the disclosure with structural details which will be readily apparent to those skilled in the art, having the benefit of the description herein. Further, the inventive concepts disclosed herein are not limited to the particular embodiments depicted in the exemplary diagrams, but should be construed in accordance with the language in the claims.

In some radio systems, both radio systems and antennas are single ended. Hence, the radio systems and antennas use an absolute common ground. Signals within the radio systems (e.g., from a signal generator) are manipulated and transitioned into an ultra-broadband wavefield via the single ended and absolute ground configuration. In these radio systems, it may be difficult to maintain absolute ground at elevated frequencies across large areas of the electronic circuitry. Thus, frequency limitations may result from such difficulties.

Some developments have occurred in differential topologies. For instance, some development has occurred in differential amplifiers, mixers, Variable Gain Amplifiers (VGAs). Further, oftentimes, digital-to-analog converters (and analog-to-digital converters) output differential signals. Typically, however, antennas and amplifiers are single ended. Accordingly, the signals from the digital-to-analog converters are converted to operate with the single ended antennas and amplifiers.

Power amplifiers are typically difficult to create differential topologies which maintain good performance characteristics. A differential structure for a power amplifier uses symmetry and balance and matching of transistors and components within the structure, and can leverage a radio frequency (RF) virtual ground that exists separately from an absolute common ground. A virtual ground is a point within a differential circuit where RF signals inside of the circuit are of equal amplitude and 180° out of phase, creating a cancellation of the signals and thus forming a null or a "0." The physical location where the signal cancellation occurs behaves as an RF virtual ground. In providing or including an RF virtual ground within the circuit, such virtual ground frees the RF circuit behavior from any limitations of physical distance and impedance of an absolute ground path in the RF domain. In some embodiments, a virtual ground may be created or placed at various points within the circuit independent of any location of an absolute ground. By freeing requirements of an absolute ground, such circuit may be relieved from ground inductive issues and, therefore, may have an increased bandwidth and improved stability behaviors.

According to the embodiments described herein, a differential power amplifier may be provided at a radiator of a differential antenna. The differential power amplifier includes an n-side half circuit and a p-side half circuit which are symmetrical and amplify positive (in-phase) and negative (out-of-phase) symmetrical (e.g., differential or complementary) signals. Such embodiments may leverage advantages of having an increased bandwidth capability. Additionally, such embodiments may be configured to correct issues that occur with statistical variations in integrated circuit components (resistors, inductors, capacitors, and transistors) which degrade symmetry and balance of differential circuit behaviors. Such an approach as described herein provides for fine tuning the bias and the balance on the large power transistor, which yields better matching of the RF characteristics (such as transconductance), linearity and power consumption scaling, and increased frequency capabilities. The RF virtual ground is physically located at a minimum distance from the emitters of the half circuits which minimizes emitter feedback inductances and improves bandwidth and stability. An RF virtual ground may also be utilized in the RF input matching circuit (e.g., between the capacitors in series between the base of the n-side half circuit and p-side half circuit) which similarly helps improve differential performance characteristics.

Referring generally to the figures, a differential power amplifier (DPA) is shown and described. The DPA includes an n-side half circuit and a p-side half circuit. The n-side and p-side half circuits include an n-side and p-side base, which receive ½ of a differential input signal (e.g., out-of-phase and in-phase portions of the differential input signal from a signal generator or other RF components configured to generate or otherwise provide a differential signal). The DPA includes an n-side biasing circuit and a p-side biasing circuit. The n-side and p-side biasing circuit are configured to provide controllable, independent n-side and p-side biasing signals to the n-side and p-side base, respectively. The DPA uses a single power source which provides positive DC voltage to the n-side and the p-side half circuits of the differential power amplifier. Hence, the DPA does not require negative voltage for bias. The DPA utilizes supply and ground circuitry structure for supplying common mode DC to the collectors of the n-side and p-side half circuits, and an RF virtual ground to the emitters of the n-side and p-side half circuits. Such embodiments enhance RF differential behaviors by self-balancing the virtual ground nodes and reducing impact of statistical variations and imperfect component matching in the IC fabrication process.

The virtual ground frees the power amplifier from limitations of traditional absolute ground by placing the "ground" (e.g., the virtual ground in the RF domain) at a physical minimum distance, which reduces ground inductance issues. Such embodiments may increase bandwidth, as it can be difficult to maintain an absolute ground at high frequencies due to ground path inductance from bond wires, stud bumps, or through wafer grounds. In some embodiments, the n-side and p-side half circuits for the differential power amplifier may be constructed from heterojunction bipolar transistors (HBT), such as indium phosphide (InP) or Silicon Germanium (SiGe) HBTs. Such transistors do not require a negative voltage like many FET based transistors (e.g., GaN, GaAs, pHEMT, etc). Rather, such transistors function properly with a positive voltage supply. Whereas other transistors require negative voltage, which adds complications to system implementation, use of HBT transistors simplify system implementations.

The n-side and p-side biasing circuit may each include digitally programmable bias current sources from Digital to Analog Converters (DACs) for setting nominal quiescent bias of the transistors for the n-side and p-side half circuits. Such n-side and p-side biasing circuits may be used for fine resolution tuning of the bias at the base on the n-side and p-side half circuits for the differential power amplifier to correct for imbalances caused by statistical variation in circuit components. The bias on the base of the n-side and p-side half circuits for the differential power amplifier may provide for scaling of DC current to maximize the full voltage range of the output signal depending on the DC voltage supplied to the differential power amplifier (e.g., by the power supply). As the voltage level of the power supply increases, more current (e.g., from the biasing circuits) is needed to get the maximum signal swing in a given operating impedance, and programming the nominal bias current allows for a wide range of output power levels while still maximizing the amplifiers efficiency. Additionally, envelope tracking of an RF signal can be implemented by applying modulation of the power supply voltage in conjunction with the bias currents to achieve higher efficiency in modulated waveforms.

In some embodiments, one or more inductors (e.g., choke inductors) may be located within the supply path circuitry and the ground path circuitry. The inductors may provide a common mode DC supply and ground path at the n-side half circuit and p-side half circuit for the differential power amplifier and the p-side power amplifier. The inductors may "choke" the RF signals from traveling up to the power source 110 or down to absolute ground. The resistors in parallel with the inductors limit the absolute magnitude of the impedance and can be used to control common mode behaviors, such as stability behaviors. At DC and low frequencies, the inductors are a low impedance (e.g., according to $Z=2\pi fL$), but the impedance increases in proportion with the frequency such that RF signals see them as an "open," or a path that is difficult to flow through. Thus, little to no voltage drop occurs across the inductors when DC bias current flows through the inductors and biases the transistors into the desired quiescent operating condition, thereby limiting voltage overhead losses in the circuit topology. Since the power supply DC voltage has a near 0 V drop across the inductors, nearly all the supply voltage is applied across the transistors in the half circuits themselves, which allows for the highest possible voltage swing at RF frequencies and maximizes efficiency capability by utilizing the full supply voltage.

Similarly, use of a parallel impedance in the ground path circuitry (e.g., connected to the emitters of the n-side and p-side half circuits of the power amplifier) has no impact on the DC behavior of the circuit, as the current flows through the inductors to ground because the inductors in parallel with the resistors have a low impedance at DC (e.g., the inductors act to effectively short out the resistors in parallel), but at higher frequencies (e.g., RF) the inductors are a high impedance. At such higher frequencies, the RF emitter currents from the n-side and p-side half circuits flows through the parallel impedance and resistor in series with the emitters of the n-side and p-side half circuits. The resistor in series with the emitters of the n-side and p-side half circuits act as the RF differential "virtual ground"

Similarly the inductors in the power supply circuit structure pass the DC current, and behave as a high impedance at high frequencies (e.g., RF) and force the RF signal to flow through alternate paths. The RF signal will be forced to flow out to the output load (e.g., the antenna) and can also be taped for a small amount of additional RF negative feedback (the R/L, in this case that goes back to the bases) which further linearizes the amplifier, controls maximum gain, extend bandwidth, can improve matching the input/output, etc.

Additionally another RF virtual ground is utilized in the RF input and matching structure where shunt capacitors are positioned in series between the n-side base and p-side base without a connection to a common mode (or absolute) ground. Where such shunt capacitors are balanced, a virtual ground is provided between the shunt capacitors due to the input and sampled output forming an equal amplitude but 180° out of phase cancellation at the mid-point between the shunt capacitors. Because these shunt capacitors are not connected to absolute ground, the differential impedance match can be optimized, while the common mode impedance is not, which improves the CMRR behavior of the differential power amplifier.

In some embodiments, various aspects of the circuit may be modified, such as using resistors instead of inductors, altering passive component values to optimize certain RF behavior characteristics or operating frequencies, vary the gain and impedance settings, and change stability behaviors. Additionally, feedback (e.g., negative RF feedback and/or common mode attenuation) may be included within the circuit to control gain, performance, and/or other characteristics of the circuit, as described in greater detail below.

Referring to FIG. 1, a radio system 100 is shown, according to an exemplary embodiment. The radio system 100 may be any device, component, or group of devices or components designed or implemented to transmit a signal across a medium. The signal may have a frequency in the electromagnetic spectrum. The radio system 100 may be used or incorporated into a number of devices and applications, such as aircraft (e.g., commercial aircraft, military aircraft, helicopter, unmanned aerial vehicle (UAV), spacecraft, and/or any other kind of vehicle, manned or unmanned), land vehicles (e.g., automobiles, military ground vehicles, etc.), as well as standalone units, such as radio broadcast systems, for instance. The radio system 100 is shown to include a signal generator 102 and an antenna system 104. The signal generator 102 may be designed or implemented to generate a differential signal for the antenna system 104.

The antenna system 104 may include an amplifier 106 and an antenna 108. The amplifier 106 shown and described herein has a differential structure for amplifying the differential signal from the signal generator 102, and the antenna 108 may be a differential antenna. The amplifier 106 may be powered by a power source 110. The amplifier 106 may include a p-side half circuit 112 and an n-side half circuit 114. A ground circuit structure 116, which is balanced, is configured to apply a DC common mode ground and RF virtual ground to the emitter of the p-side half circuit 112 and n-side half circuit 114. The signal generator 102 may provide the differential input signal to the base of the n-side and p-side half circuit 112, 114. The amplifier 106 may include a p-side biasing circuit 118 and n-side biasing circuit 120. The p-side biasing circuit 118 and n-side biasing circuit 120 may apply a p-side and n-side biasing signal to the base of the n-side and p-side half circuits 112, 114, respectively. The n-side half circuit 114 and p-side half circuit 112 may amplify the differential input signal to generate a differential output signal, which is provided to the antenna 108.

Various aspects of the present disclosure are described with reference to the figures. Several embodiments of the disclosure are described with respect to various circuitry and arrangements of circuit components. However, the present disclosure is not limited to the particular circuit arrangements. Rather, the present disclosure contemplates various modifications to the circuit arrangements shown and described herein. Thus, the circuit arrangements described herein are exemplary in nature.

Figure 2:
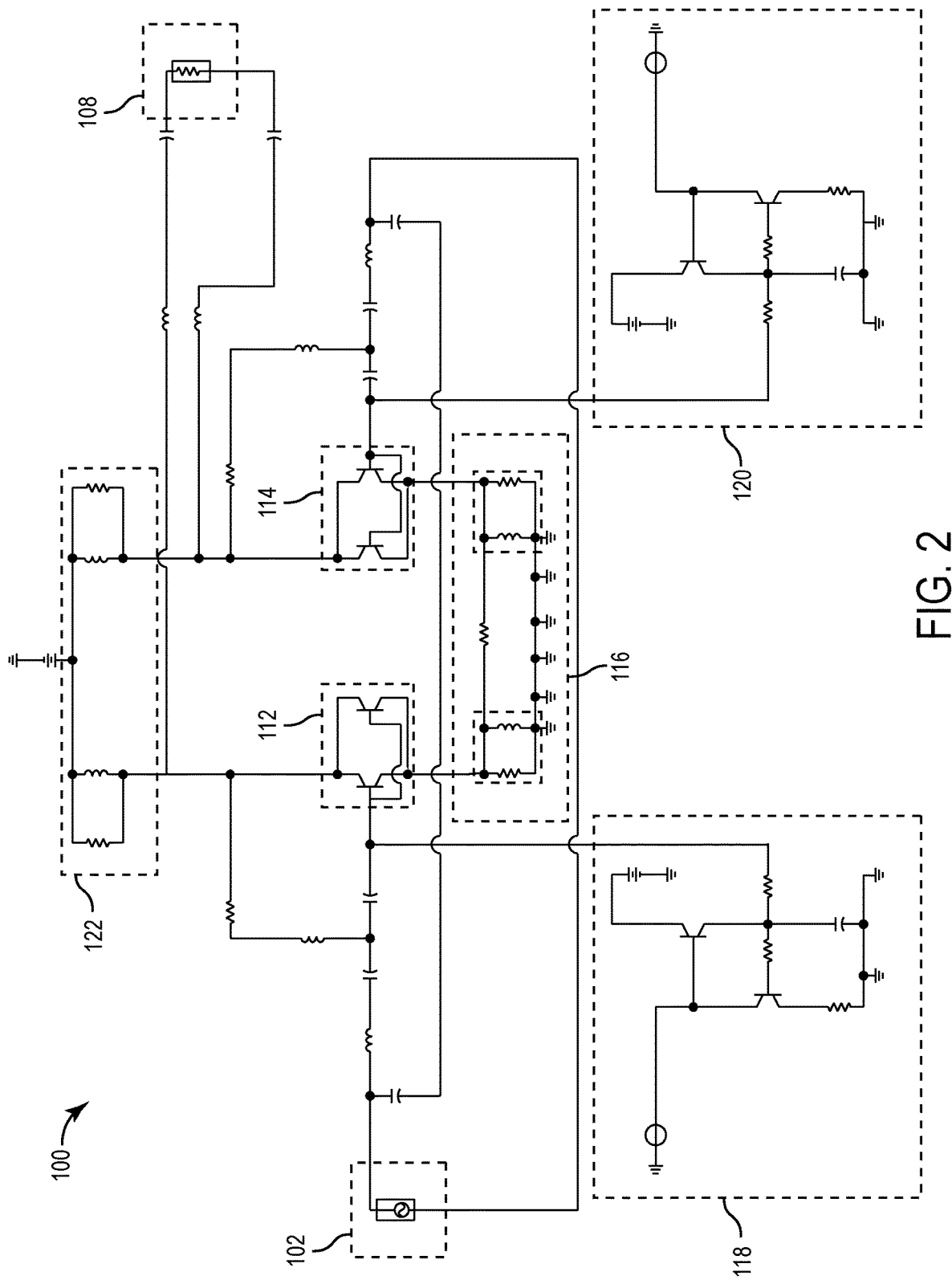
FIG. 2 is a circuit diagram of the radio system of FIG. 1, according to exemplary aspects of the inventive concepts disclosed herein.
Figure 3:
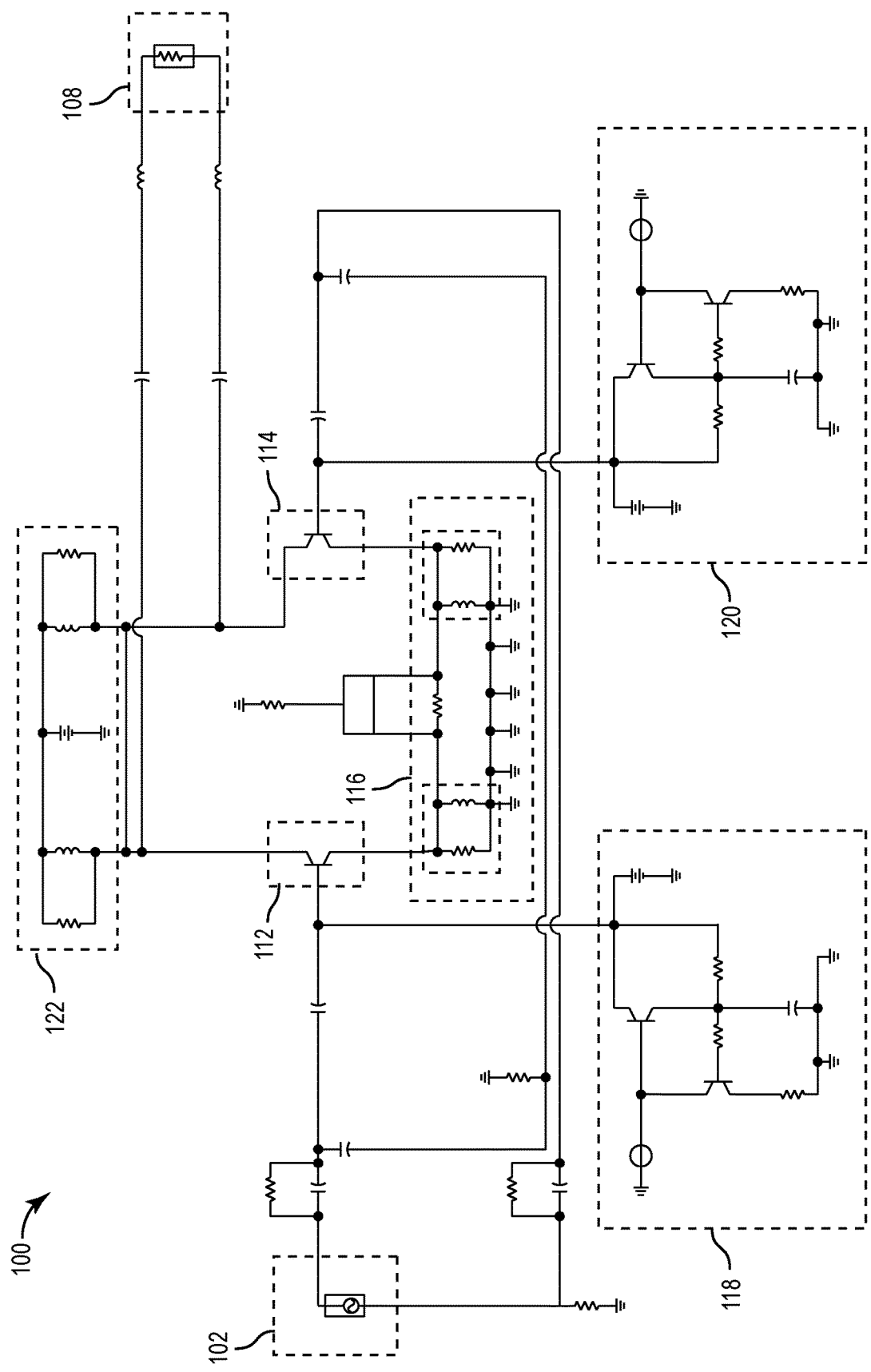
FIG. 3 is another embodiments of a circuit diagram of the radio system of FIG. 1, according to exemplary aspects of the inventive concepts disclosed herein.

Referring now to FIG. 1 and FIGS. 2-3, several embodiments of the radio system 100 is shown. Specifically, FIG. 2 depicts one embodiment of a circuit diagram for the radio system 100, and FIG. 3 depicts another embodiment of a circuit diagram for the radio system 100. As stated above, the particular circuit arrangement shown in FIG. 2 and FIG. 3 are for exemplary purposes.

The radio system 100 is shown to include a signal generator 102. The signal generator 102 may be any device, component, or group of devices or components configured to generate, produce, provide, or otherwise output an input signal. In some embodiments, the signal generator 102 may output a complementary (or differential) input signal. The input signal may be a differential input signal corresponding to a signal desired to be transmitted across a medium (e.g., by the radiator of the antenna 108). The signal generator 102 may generally be a source for the differential input signal, which is amplified (e.g., by the half circuits 112, 114 of the differential amplifier 106) to generate the differential output signal transmitted by the radiator of the antenna 108.

The signal generator 102 may generate a signal having a frequency in the radio range of the electromagnetic spectrum. An electromagnetic wave within the radio range is an electromagnetic wave having a frequency between 3 Hz and 3 THz. Hence, the signal from the signal generator 102 may have a frequency within 3 Hz and 3 THz. The frequency, amplitude, etc. of the signal may vary according to various desired characteristics. For instance, where the signal corresponds to a song, the frequency and amplitude may vary with pitch, notes, etc.

The signal generator 102 may provide the differential input signal (e.g., the positive, or in-phase, half and negative, or out-of-phase half) to the base of the p-side half circuit 112 and n-side half circuit 114, respectively. In some embodiments, two capacitors may extend in series between the base of the p-side half circuit 112 and the base of the n-side half circuit 114. The positive end of the two capacitors may each be tied to the positive and negative outputs (which output the positive and negative differential signals) from the signal generator 102. The two capacitors may be balanced such that the in-phase and out-of-phase differential signals cancel each other out to form a virtual ground between the two capacitors. Such a virtual ground from the capacitors improves differential performance characteristics.

With reference to the p-side half circuit 112, an inductor in series with another capacitor forming a matching circuit may simulate transmission line effects, and may be used for further stabilizing the circuit to prevent runoff and oscillation.

The radio system 100 is shown to include a power source 110. The power source 110 may be a DC power source. In some embodiments, the power source 110 may be or include locally-stored power (e.g., battery power). In some embodiments, the power source 110 may be or include external power (e.g., stepped down power from a power grid). The power source 110 may provide electrical power to the collector of the n-side half circuit 114 and p-side half circuit 112. In some embodiments, the power source 110 may output DC current. In some embodiments, the power source 110 may output DC voltage. The power source 110 may provide electrical power to the collectors of the p-side half circuit 112 and n-side half circuit 114.

In some embodiments, the power source 110 may provide power to the collector of the p-side half circuit 112 and n-side half circuit 114 through a supply circuit structure 122. The supply circuit structure 122 is shown to include an inductor in parallel with a resistor connected between the power source 110 and the collector of the p-side and n-side half circuits 112, 114. The inductor may act as a choke inductor. Hence, DC (or common mode) power may flow through the inductor, but RF may see the inductor as open, thus rejecting RF signals—thereby "choking" RF signals from flowing upwardly to the power source 110. The resistor may limit the overall impedance of the inductor (e.g., acting as a DQ'ing resistor).

The differential output signal for the antenna 108 may be produced at the collectors of the n-side half circuit 114 and p-side half circuit 112. The differential output signal may be provided to a radiator for the antenna 108. When an in-phase differential input signal is applied to the base of the p-side half circuit 112 a corresponding out-of-phase differential input signal is applied the n-side half circuit 114 (and vice versa). The p-side half circuit 112 amplifies the in-phase differential input signal, and the n-side half circuit 114 amplifies the out-of-phase differential input signal. The p-side half circuit 112 pulls current from the n-side half circuit 114, through the load (e.g., the antenna 108), and to the p-side half circuit 112. Similarly, the n-side half circuit 114 pulls current from the p-side half circuit 112, through the load (e.g., the antenna 108), and to the n-side half circuit 114. The collector of the p-side half circuit 112 may draw a current corresponding to (e.g., in proportion to) the signal applied to the base of the p-side half circuit 112. Similarly, the collector of the n-side half circuit 114 may draw a current corresponding to (e.g., in proportion to) the signal applied to the base of the n-side half circuit 114. In this regard, the respective collectors of the p-side and n-side half circuits 112, 114 draw current across the load and from the other half circuit 114, 112 in proportion to the signal applied to their respective bases. Hence, the p-side and n-side half circuits 112, 114 may push and pull current across the load in proportion to the input signal applied to the base.

In some embodiments, the serially arranged inductors and capacitors from the collectors of the p-side and n-side half circuits 112, 114 may account for physical distance to compensate for transmission line characteristics at high frequencies and optimize output characteristics. Where the circuit is properly balanced, a virtual ground may form within the center of the load (e.g., the antenna 108). In some embodiments, the antenna 108 may be an electronically steerable antenna (e.g., the signal may be steered into various locations within the environment via phased array). Such embodiments may benefit from decreased noise and complication of the circuit, as described in greater detail below.

The p-side and n-side half circuits 112, 114 may receive the differential input signals from the signal generator 102. In some embodiments, the p-side and n-side half circuits 112, 114 may each include two or more transistors. For instance, the p-side half circuit 112 may include two transistors (e.g., a first and second transistor) arranged in parallel, and the n-side half circuit 114 may include two transistors arranged in parallel. Hence, for the p-side half circuit 112 and the n-side half circuit 114, the emitters, bases, and collectors of each transistor may be tied together.

In some embodiments, the p-side and n-side half circuits 112, 114 may be constructed from power transistors. For instance, the p-side and n-side half circuits 112, 114 may be constructed from Heterojunction Bipolar Transistor (HPT) transistors, such as Indium Phosphide (InP) or Silicon Germanium (SiGe) HPT transistors. Hence, the first and second transistor for p-side half circuit 112 and the first transistor and second transistor for the n-side half circuit 114 may each be HPT transistors. In implementations where the p-side and n-side half circuits 112, 114 are constructed from HPT transistors, such transistors do not require negative voltages. Most field-effect transistors (FETs), such as Gallium Nitrite or Arsenide, etc., require a negative voltage, which may add complication to circuitry for implementing the radio system 100. Where HPT transistors are used for constructing the power amplifiers 112, 114, such transistors may only require positive voltages or currents (e.g., from the power source 110) and biasing, which is supplied from the n-side and p-side biasing circuits 118, 120, as described in greater detail below.

The biasing circuits 118, 120 may bias the transistors in the p-side and n-side half circuits 112, 114 to their quiescent (Q) DC operating point (or Q point). The Q point may be an operating point of a transistor at which the transistor is sufficiently biased with current to maximize the current swing through a load. The biasing circuits 118, 120 may bias the transistors in the p-side and n-side half circuits 112, 114 to their Q points such that the transistors can swing current through the load with sufficient magnitude that the voltage swing (according to V=IR) fully utilizes the power supply DC voltage, thus maximizing power efficiency. Briefly, the biasing circuits 118, 120 may include a complementary metal-oxide semiconductor (CMOS) transistor structure for outputting a biasing signal for biasing the input signal. Such a structure may be compatible with HPT transistors, whereas other types of power transistors (which may require large input voltages) may not be compatible (or easily integrated with) CMOS nodes. The p-side and n-side half circuit 112, 114 may be supplied with (e.g., by the virtual ground circuit 116) a common mode DC path. The common mode DC path, in conjunction with biasing the input signal, may attribute to increased efficiency by maximizing the output swing for a given input signal. Further, the structure and composition of the circuit described herein may be compatible with an electronically steerable antenna by limiting the number of overall elements and power consumption. In some embodiments, the power source 110 may provide different output power according to power needs for the output signal. The biasing circuits 118, 120 may correspondingly modify the Q point of the transistors in the p-side and n-side half circuits 112, 114. As the voltage level of the power supply increases, more current (e.g., from the biasing circuits 118, 120) is needed to get the maximum signal swing in a given operating impedance, and programming the nominal bias current allows for a wide range of output power levels while still maximizing the amplifiers 106 efficiency. Additionally, envelope tracking of an RF signal can be implemented by applying modulation of the power source 110 voltage in conjunction with the bias currents to achieve higher efficiency in modulated waveforms.

As shown in FIG. 1 and FIGS. 2-3, a differential input signal generated by the signal generator 102 may be applied to the base of the half circuits 112, 114. The radio system 100 is shown to include an p-side biasing circuit 118 and an n-side biasing circuit 120. The p-side biasing circuit 118 and n-side biasing circuit 120 may be any device, component, or group of devices or components configured to generate, produce, or otherwise output a biasing signal. The biasing signal from the p-side biasing circuit 118 may be independent from the biasing signal from the n-side biasing circuit 120. The biasing signal may be a biasing current, a biasing voltage, etc. The respective independent biasing signals may bias the transistors for the p-side and n-side half circuits 112, 114. The biasing signal may bias the transistors of the p-side and n-side half circuits 112, 114 to their respective Q points, as described above. Such embodiments may maximize performance of the power amplification and eliminate potential clipping of the output signal.

The p-side biasing circuit 118 and n-side biasing circuit 120 may each provide an independent biasing signal to the base of the p-side half circuit 112 and base of the n-side half circuit 114, respectively. In some embodiments, the biasing circuits 118, 120 may be CMOS digital-to-analog converter (DAC) biasing circuits. Hence, the biasing circuits 118, 120 may each include a DAC and controller for high resolution fine-tuning of the biasing signal output from the respective biasing circuit 118, 120.

The biasing circuits 118, 120 may output, generate, or otherwise provide a biasing signal, which may be applied to the base of each transistor for the respective half circuits 112, 114 (e.g., the p-side biasing circuit 118 may apply a biasing signal to the p-side half circuit 112 and the n-side biasing circuit 120 may apply an independent biasing signal to the n-side half circuit 114). In some embodiments, the biasing signal may be a biasing current. Thus, the biasing circuits 118, 120 may provide an p-side and n-side biasing current to the base of the p-side half circuit 112, and base of the n-side half circuit 114.

Where the biasing circuits 118, 120 include a DAC, a controller (such as a CMOS controller with digital control) may output a digital signal, which may be converted (e.g., by the DAC) for varying the biasing current applied to the p-side half circuit 112 and n-side half circuit 114. Thus, the biasing circuits 118, 120 may fine-tune the biasing signals to accommodate for variations, noise, or DC offsets that may occur within the circuit or otherwise cause an imbalance within the circuit. Such fine tuning may yield better performance of the differential circuit, which may be balanced through such fine tuning. Where the p-side half circuit 112 and n-side half circuit 114 are balanced, such amplifiers may behave in a similar manner, thus maximizing the virtual ground advantage described in greater detail below. Such fine tuning may also address any manufacturing defects or variations that may occur across wafers for the p-side and n-side half circuits 112, 114 and/or other components within the circuit topology. Furthermore, by providing independent controllers for controlling both the n-side and p-side biasing circuits 118, 120, the controllers may fix or address nay offset or imbalance within the circuit.

As described above, the power amplifiers 112, 114 may be supplied a virtual ground. "Virtual ground" as used herein refers to a ground resulting from signals meeting at a point within a circuit which are 180° out-of-phase (or complementary), thus canceling each other out to form a zero overall voltage. The radio system 100 is shown to include a ground circuit structure 116. The ground circuit structure 116 may be balanced to form a virtual ground near the emitter of the p-side half circuit 112 and the n-side half circuit 114. As shown in FIG. 2, the ground circuit structure 116 is shown to include a first resistor arranged in parallel with the emitter of the p-side half circuit 112 and the emitter of the n-side half circuit 114. The circuits shown in the radio system 100 may be balanced such that the virtual ground is located within the first resistor.

The virtual ground circuit 116 may include a p-side common mode sub-circuit 200, and an n-side common mode sub-circuit 202. The p-side common mode sub-circuit 200 may include an inductor arranged in parallel with a resistor. Similarly, the n-side common mode sub-circuit 202 may include an inductor arranged in parallel with a resistor. The p-side common mode sub-circuit 200 may be arranged between the emitter of the p-side half circuit 112 and absolute ground, and the n-side common mode sub-circuit 202 may be arranged between the emitter of the n-side half circuit 114 and absolute ground.

The inductors in the p-side common mode sub-circuit 200 and n-side common mode sub-circuit 202 may each provide a common mode DC ground path for the p-side half circuit 112 and the n-side half circuit 114. The inductors may be choke inductors to provide a DC (or common mode) flow, but limit RF flow. For instance, at RF, the inductors may be seen as "open" or having a high impedance (similar to the inductors described above in the supply circuit structure 122). At DC, the inductors may have low impedance such that the inductors essentially short out the parallel resistor and provide a path to common mode ground. Thus, the inductors in the supply circuit structure 122 and ground circuit structure 116 may provide for substantially the full supply range of the power supply 110 in common mode while limiting differential RF flow.

As described above, the virtual ground may occur within the resistor in parallel with the n-side half circuit 114 and the p-side half circuit 112. The virtual ground may be a result of balances between the n-side and p-side of the circuit (e.g., n-side half circuit 114 and biasing circuit 118, and p-side half circuit 112 and biasing circuit 120) which cause the differential signals to meet and cancel each other out, thereby forming the virtual ground. Additionally, as described above, a virtual ground may also be located between the capacitors extending in parallel between the base of the p-side half circuit 112 and base of the n-side half circuit 114. A virtual ground may also be located at (or near) the center of the load (e.g., the antenna 108), and at or near the center of the source (e.g., the signal generator 102).

Referring now to FIG. 2 and FIG. 3, in some embodiments, feedback and stabilizing structures may be positioned within the circuit to control RF and common mode characteristics. Specifically, FIG. 2 shows an implementation including RF output to input, and emitter degeneration, negative feedback, and FIG. 3 shows an implementation without output to input feedback but including common mode degeneration stabilizing structures.

As shown in FIG. 2, the circuit may include various RF feedback, such as negative RF feedback between the collector and the base, and at the emitter. In some embodiments, the circuit may include an inductor and resistor arranged in series between the collector and the base of the p-side half circuit 112 and n-side circuit 114, which may act as negative RF feedback. The feedback positioned between the base and the collector may control RF gain, and may control input and output impedances. Such embodiments may act as negative RF feedback with minimal penalty to power-added efficiency (PAE). A similar feedback and matching circuit structure may be provided between the base and the collector of the n-side half circuit 114.

In some embodiments, a resistor extending between the emitter of the p-side half circuit 112 and emitter of the n-side half circuit 114 may also act as negative RF feedback. The resistor extending between the emitter of the p-side half circuit 112 and n-side half circuit 114 may act as negative RF feedback and help increase transistor base impedance, improving matching, improve linearity and stabilizing gain, thereby improving broadband RF behaviors. However, at DC, the inductors (in the p-side common mode sub-circuit 200 n-side common mode sub-circuit 202) may be seen as shorts, thus the resistor has no impact on DC bias behavior of the transistors or voltage overhead losses. Hence, the resistor may generally provide negative feedback in RF, but may not implicate the performance in DC. The resistor may not impact DC voltage overhead and reduces power efficiency impact.

Where the circuit topology is well balanced, the RF emitter currents from p-side half circuit 112 and n-side half circuit 114 are equal in amplitude and 180° out of phase exactly in the mathematical and physical center of the resistor, at which point the signals cancel and form a null or 0 signal, which is the RF virtual ground location. In instances where there are slight imperfections or imbalance between the p-side half circuit 112 and n-side half circuit 114 (or in the circuit topology in general), the signals will not be exactly the same magnitude and 180 out of phase. However, the virtual ground may still form within the resistor, just not at the exact middle, thus allowing for some "self-balancing" for the RF characteristics. This resistor with the RF virtual ground also acts as an RF negative feedback element without paying any penalty of DC voltage drop which would impact maximum efficiency capability. The RF negative feedback element also linearizes the transfer function of the transistors, increases the base impedance of the transistors making the amplifier easier to broadband match, increases the stability of the amplifier, and increases gain flatness across RF frequency range. And since it is co-located right by the transistors, the physical length of the RF ground path is an absolute minimum distance allowing for maximum stable gain frequency coverage. The resistor may self-center the RF virtual ground extending between the emitter of the p-side half circuit 112 and emitter of the n-side half circuit 114 regardless of statistical variations between the two differential half circuits, which further improves circuit balance (e.g. symmetry).

The circuit shown in FIG. 2 may generally include negative RF feedback for controlling characteristics of the circuit in RF. The circuit shown in FIG. 3 may generally include common mode feedback for controlling characteristics of the circuit in common mode.

As shown in FIG. 3, the circuit may include common mode stabilizing structures. In some embodiments, the common mode stabilizing structures may include a resistor in parallel with a capacitor arranged between the signal generator 102 and base. In some embodiments, the common mode feedback may include a resistor extending between the capacitors serially arranged between the bases of the p-side half circuit 112, and n-side half circuit 114. The resistor may extend between the capacitors and absolute ground.

The common mode feedback at the input may include a resistor in parallel with a capacitor. The resistor may be included for low frequency stability control. The resistor may attenuate the signal at low frequency and RF common mode to prevent oscillations. Additionally, the resistor extending between the capacitors serially arranged between the bases of the p-side half circuit 112 and n-side half circuit 114 and ground may act to attenuate common mode signals to prevent oscillations.

Each of the embodiments described above may provide for wideband applications, relatively flat gain, and good matching across a large frequency range. The circuit may be balanced to maintain differential benefits, while omitting unnecessary conversions between single ended and differential signals for amplification. The circuit may include a flat gain across a relatively wide frequency range. Additionally, as described above, the power output from the power source may be tuned and correspondingly the independent biasing signals may be tuned to fit the power amplifier 106 to different applications.

Referring now to FIG. 4 through FIG. 7, various testing results and plots are shown. The following example plots are shown merely for exemplary purposes. The present disclosure is not in any way limited by the representations shown in these plots. Rather, the following plots are a representation of potential results.

The following figures show sample results of testing the aforementioned circuits and components at various frequencies. As can be seen, the radio system 100 described above has an increased broadband that spans two decades of frequencies. The radio system 100 may be used in several different applications. For instance, the biases may be adjusted or tuned to scale the output power according to various applications. The output for the power source 110 may be increased, and the bias may correspondingly be increased to increase the power of the output signal. Similarly, the bias may be decreased to conserve power for the output. The radio system 100 may maintain a strong bandwidth over a relatively large DC power and RF power output range, which may be beneficial in several different applications.

Figure 4:
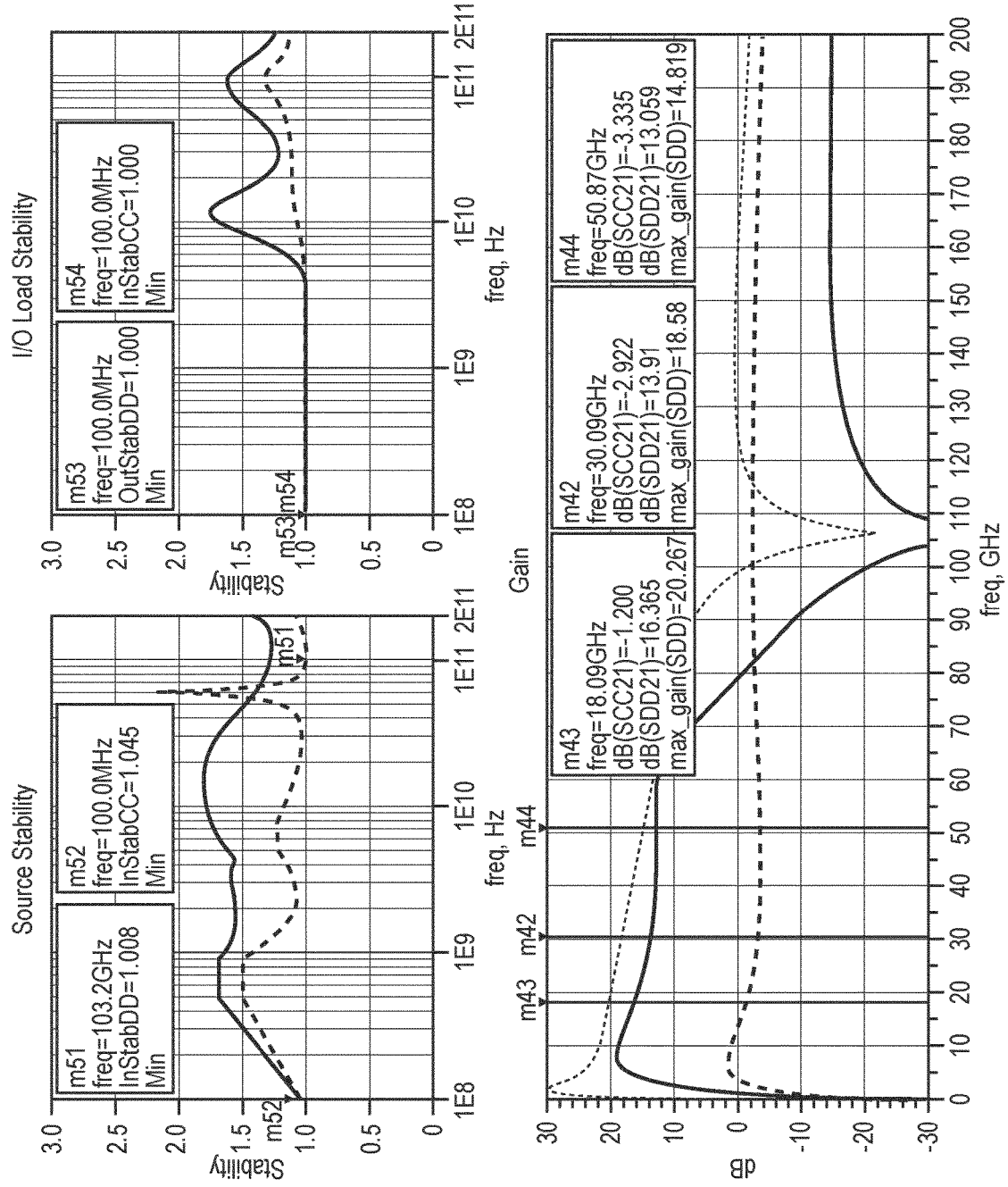
FIG. 4 is a first set of plots showing stability and gain characteristics of the radio system of FIG. 1, according to exemplary aspects of the inventive concepts disclosed herein.

As can be best seen in FIG. 4, the source and load stability may be unconditionally stable at both common and differential mode across a large range of frequencies. Where the source and I/O load stability remains equal to or greater than 1.0, the source and I/O load stability can be referred to as unconditionally stable. As can be seen in FIG. 4, the source and I/O load stability remain at or above 1 and thus the circuit is unconditionally stable. Additionally, in the graph on the bottom of FIG. 4, the gain flatness can be seen to be relatively flat across a broad spectrum of frequencies. The differential gain is shown to be 16-17 dB greater than the common mode gain across multiple decades of bandwidth showing the above-mentioned embodiments have increased common mode rejection ratio. The differential gain is also relatively flat across a broad spectrum of frequencies.

Referring to FIG. 5-8, plots from various signals of varying powers are shown, according to exemplary embodiments. Such embodiments show that the power consumption of the embodiments described above may be scaled and adapted to optimize the above-embodiments according to various desired characteristics, such as battery power, transmission range, etc., while still maintaining good gain results, bandwidth and power added efficiency.

Figure 5:
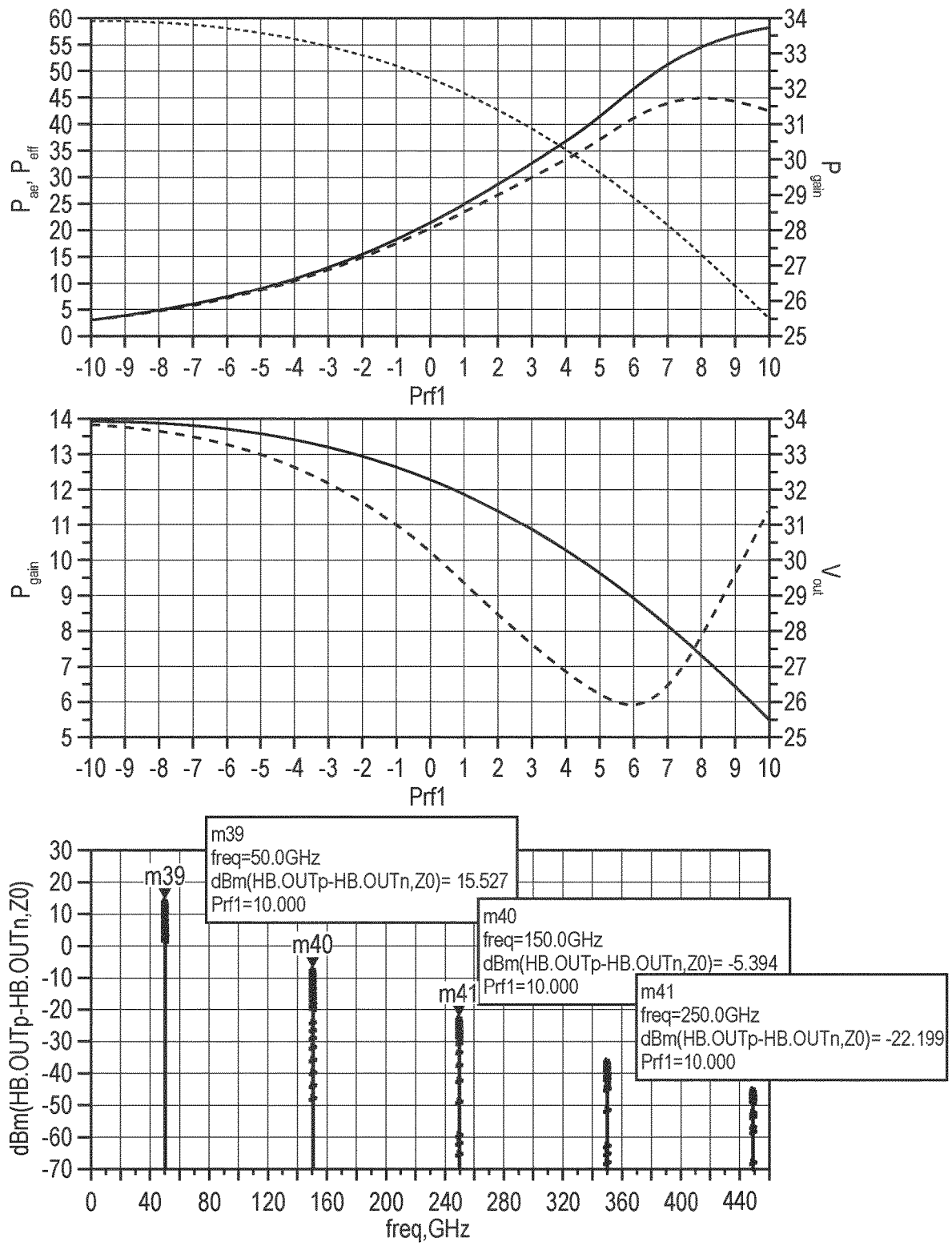
FIG. 5 is a second set of plots showing efficiency, gain, phase distortion, and spectral output at 1.3 V, according to exemplary aspects of the inventive concepts disclosed herein.

The top left graph in FIG. 5 shows input power versus power gain (on the right) and power added efficiency and collector efficiency (on the left) with a 1.3V voltage supply. As can be seen, the efficiency (both power added efficiency and collector efficiency) increases as the power input increases. Both the power added efficiency and the collector efficiency at 50 GHz are shown as tracking one another with PAE exceeding 45% and Peff approaching 60%, indicating that the circuit is capable of extremely good power efficiencies at a very low supply voltage of 1.3V.

The bottom left graph of FIG. 5 shows the phase distortion and gain compression versus the input power. As can be seen, the amplifier has a minimal amount of phase distortion as it goes into gain compression. Such embodiments minimize the distortion of signals that are applied to the circuit.

The bottom right graph of FIG. 5 shows a spectral output in the frequency domain. The first signal coincides with a one-to-one frequency translation (e.g., where the input signal is at 50 GHz, the output is at 50 GHz). The benefit of using a differential configuration is that, where the circuit is well balanced, the even order harmonics are suppressed which reduces filtering requirements as less undesired frequency content is produced from the amplifier. The second largest signal out of the DPA is shown to be the third order harmonics at 150 GHz. Such embodiments simplify filtration of harmonics.

Figure 6:
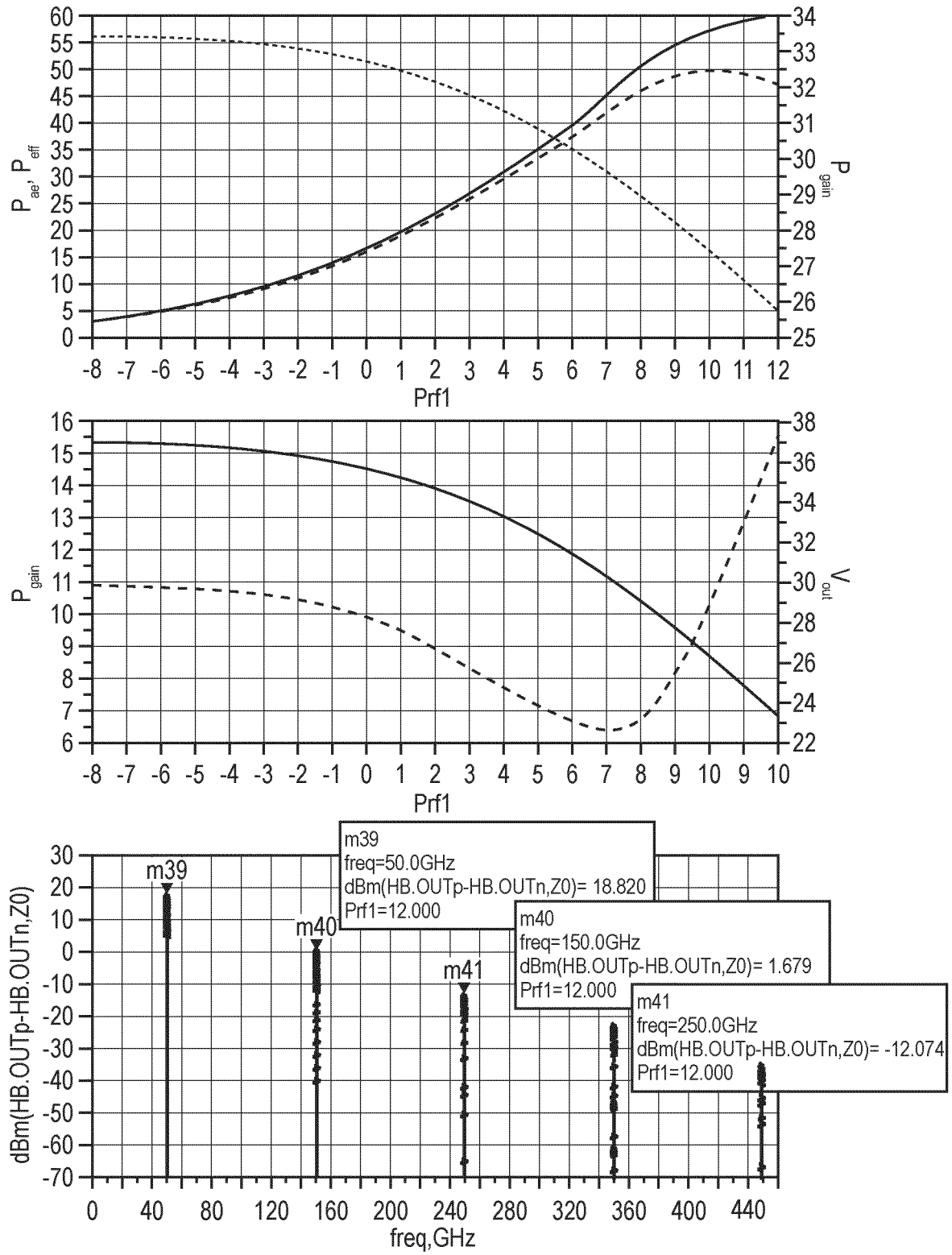
FIG. 6 is a third set of plots showing efficiency, gain, phase distortion, and spectral output at 2 V, according to exemplary aspects of the inventive concepts disclosed herein.
Figure 7:
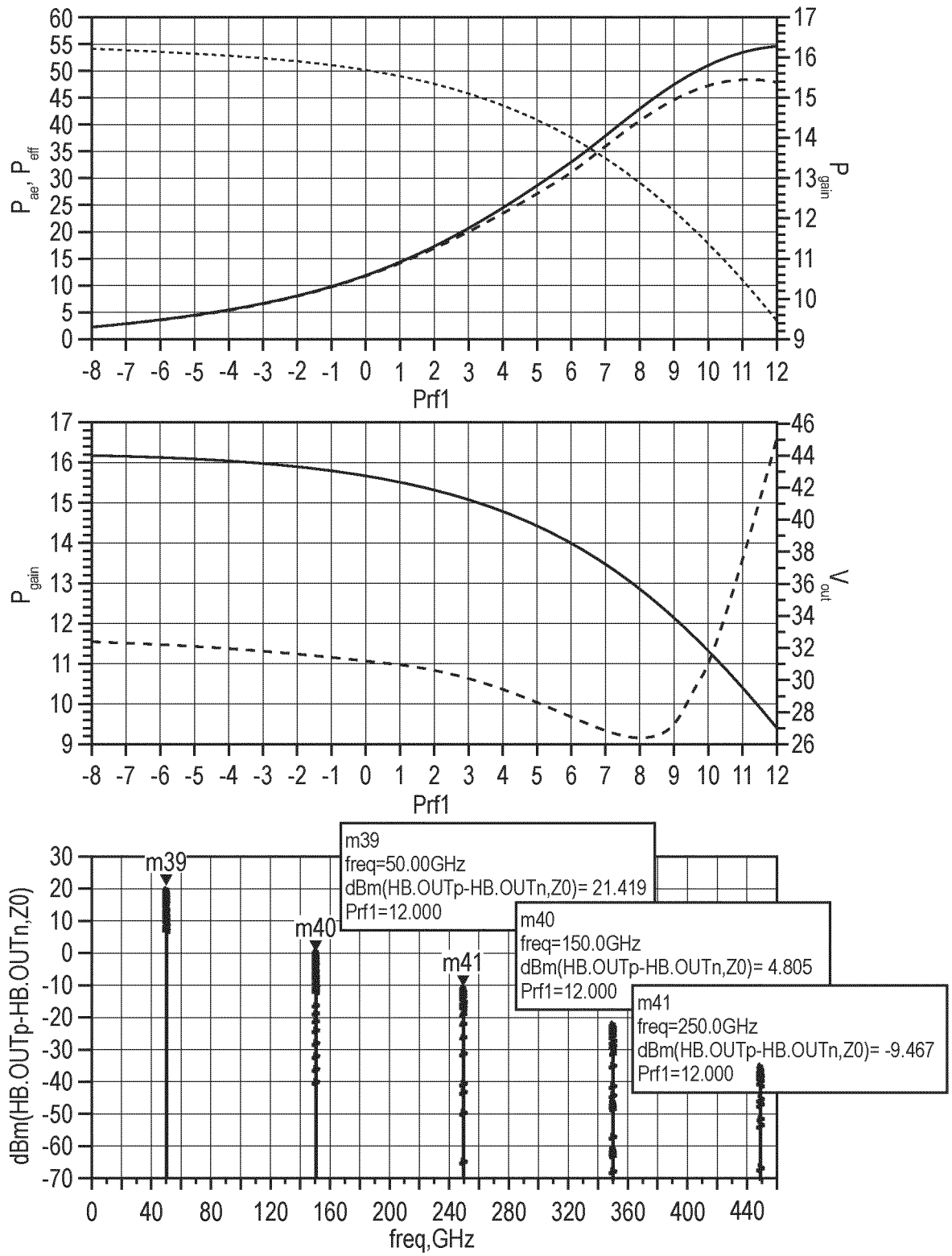
FIG. 7 is a fourth set of plots showing efficiency, gain, phase distortion, and spectral output at 3 V, according to exemplary aspects of the inventive concepts disclosed herein.
Figure 8:
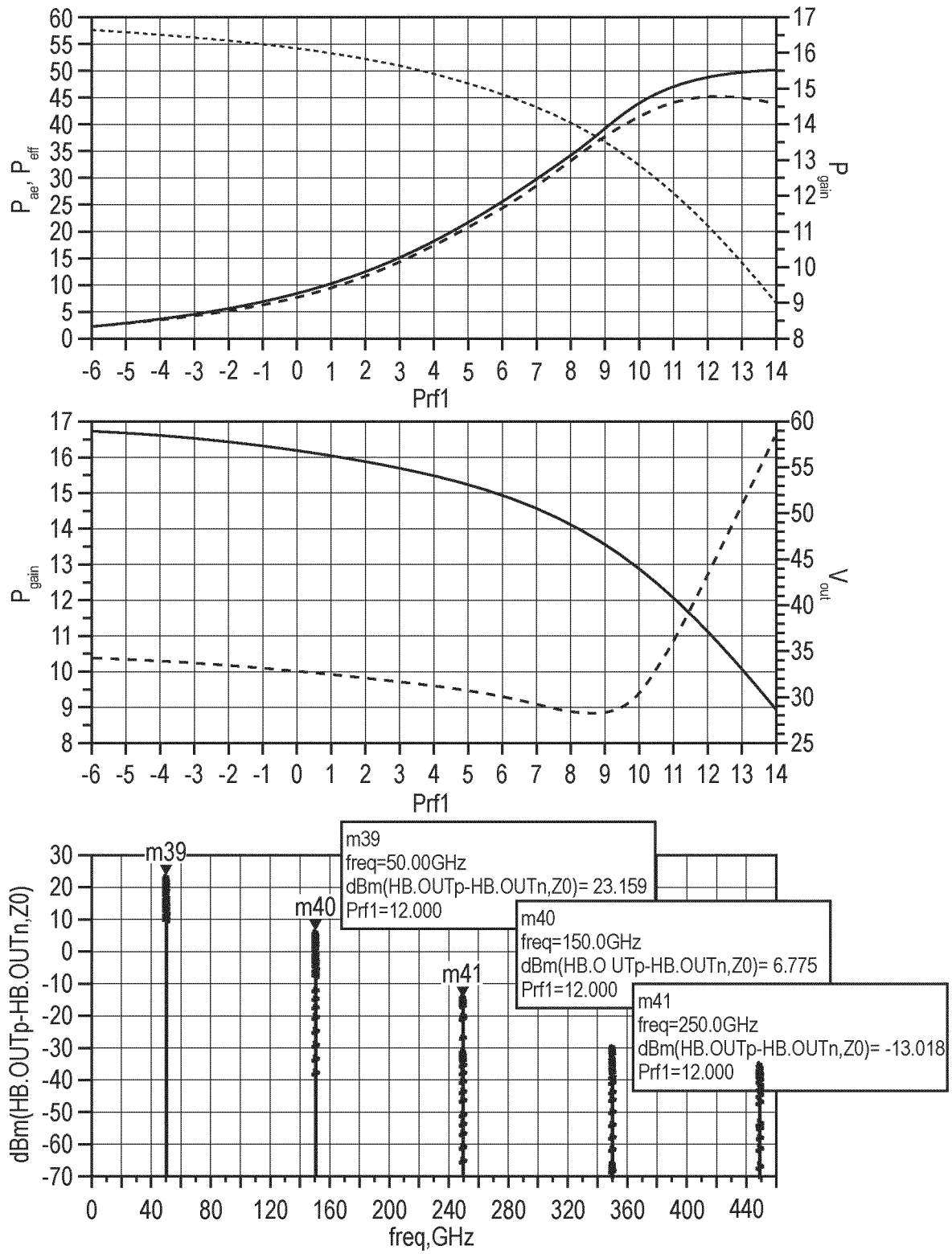
FIG. 8 is a fifth set of plots showing efficiency, gain, and phase distortion, and spectral output at 4 V, according to exemplary aspects of the inventive concepts disclosed herein.

As can be seen, the results described above in FIG. 5 carry over in higher power output scenarios, such as those shown in FIG. 6 through FIG. 8 as supply voltages are increased from the 1.3V previously to 4V, and shows the PAE and Peff maintaining extreme efficiency capability across a nearly 8 dB, or 600%, range of output powers The scope of this disclosure should be determined by the claims, their legal equivalents and the fact that it fully encompasses other embodiments which may become apparent to those skilled in the art. All structural, electrical and functional equivalents to the elements of the above-described disclosure that are known to those of ordinary skill in the art are expressly incorporated herein by reference and are intended to be encompassed by the present claims. A reference to an element in the singular is not intended to mean one and only one, unless explicitly so stated, but rather it should be construed to mean at least one. No claim element herein is to be construed under the provisions of 35 U.S.C. § 112, sixth paragraph, unless the element is expressly recited using the phrase "means for." Furthermore, no element, component or method step in the present disclosure is intended to be dedicated to the public, regardless of whether the element, component or method step is explicitly recited in the claims.

Embodiments of the inventive concepts disclosed herein have been described with reference to drawings. The drawings illustrate certain details of specific embodiments that implement the systems and methods and programs of the present disclosure. However, describing the embodiments with drawings should not be construed as imposing any limitations that may be present in the drawings. The present disclosure contemplates methods, systems and program products on any machine-readable media for accomplishing its operations. Embodiments of the inventive concepts disclosed herein may be implemented using an existing computer processor, or by a special purpose computer processor incorporated for this or another purpose or by a hardwired system.

Embodiments in the inventive concepts disclosed herein have been described in the general context of method steps which may be implemented in one embodiment by a program product including machine-executable instructions, such as program code, for example in the form of program modules executed by machines in networked environments. Generally, program modules include routines, programs, objects, components, data structures, etc. that perform particular tasks or implement particular abstract data types. Machine-executable instructions, associated data structures, and program modules represent examples of program code for executing steps of the methods disclosed herein. The particular sequence of such executable instructions or associated data structures represent examples of corresponding acts for implementing the functions described in such steps.

It should be noted that although the diagrams herein may show a specific order and composition of method steps, it is understood that the order of these steps may differ from what is depicted. For example, two or more steps may be performed concurrently or with partial concurrence. Also, some method steps that are performed as discrete steps may be combined, steps being performed as a combined step may be separated into discrete steps, the sequence of certain processes may be reversed or otherwise varied, and the nature or number of discrete processes may be altered or varied. The order or sequence of any element or apparatus may be varied or substituted according to alternative embodiments. Accordingly, all such modifications are intended to be included within the scope of the present disclosure.

The foregoing description of embodiments has been presented for purposes of illustration and description. It is not intended to be exhaustive or to limit the subject matter to the precise form disclosed, and modifications and variations are possible in light of the above teachings or may be acquired from practice of the subject matter disclosed herein. The embodiments were chosen and described in order to explain the principals of the disclosed subject matter and its practical application to enable one skilled in the art to utilize the disclosed subject matter in various embodiments and with various modifications as are suited to the particular use contemplated. Other substitutions, modifications, changes and omissions may be made in the design, operating conditions and arrangement of the embodiments without departing from the scope of the presently disclosed subject matter.

What is claimed is:

1. A differential power amplifier comprising:
a p-side half circuit having a p-side base configured to receive an in-phase signal of a differential input signal;
an n-side half circuit having an n-side base configured to receive an out-of-phase signal of the differential input signal;
a p-side biasing circuit configured to provide a controllable p-side biasing signal to the p-side base;
an n-side biasing circuit configured to provide a controllable n-side biasing signal to the n-side base, whereby the n-side biasing circuit and p-side biasing circuit operate independently of one another;
a power source configured to apply a positive direct current (DC) voltage to a collector of the n-side half circuit and a collector of the p-side half circuit of the power amplifier; and
supply and grounding circuit structures which provides common mode DC paths for the collector and emitter of the n-side and p-side half circuit to the power source and absolute ground, and balances the n-side and p-side half circuits to provide a radio frequency (RF) virtual ground to the emitter of the n-side half circuit and p-side half circuit, wherein the supply and grounding circuit structure comprise:
a first resistor arranged in parallel between the emitter of the n-side half circuit of the power amplifier and the emitter of the p-side half circuit of the power amplifier;
a first inductor arranged in parallel with a second resistor, the first inductor and second resistor connected to the emitter of the n-side half circuit of the power amplifier and absolute ground; and
a second inductor arranged in parallel with a third resistor, the second inductor and third resistor connected to the emitter of the p-side half circuit of the power amplifier and absolute ground.

2. The differential power amplifier of claim 1, wherein the differential power amplifier is a wideband amplifier and the p-side half circuit comprises:
a first transistor; and
a second transistor arranged in parallel with the first transistor.

3. The differential power amplifier of claim 2, wherein the first transistor and second transistor are heterojunction bipolar transistors.

4. The differential power amplifier of claim 1, further comprising:
negative RF feedback circuit including a resistor in series with an inductor, the negative RF feedback circuit positioned between the collector of the p-side half circuit and a base of the p-side half circuit.

5. The differential power amplifier of claim 1, further comprising:
first and second capacitors arranged in series and extending between the p-side base of the p-side half circuit and the n-side base of the n-side half circuit, whereby the first and second capacitors are balanced to provide a second RF virtual ground between the first and second capacitors.

6. The differential power amplifier of claim 5, further comprising:
common mode feedback connected between the first and second capacitor and absolute ground.

7. The differential power amplifier of claim 1, wherein the n-side biasing circuit-variably tunes the biasing signal applied to the n-side half circuit.

8. The differential power amplifier of claim 7, wherein the p-side biasing circuit variably tunes the biasing signal applied to the n-side half circuit.

9. An antenna system, comprising:
a differential antenna;
a differential power amplifier communicably coupled to the differential antenna, the differential power amplifier providing an amplified differential output signal to the differential antenna, the amplified differential output signal corresponding to a differential input signal, the differential power amplifier comprising:
a p-side half circuit having a p-side base configured to receive an in-phase signal of the differential input signal;
an n-side half circuit having an n-side base configured to receive an out-of-phase signal of the differential input signal;
a p-side biasing circuit configured to provide a controllable p-side biasing signal to the p-side base;
an n-side biasing circuit configured to provide a controllable n-side biasing signal to the n-side base, whereby the n-side biasing circuit and p-side biasing circuit operate independently of one another;
a power source configured to apply a positive direct current (DC) voltage to a collector of the n-side half circuit and a collector of the p-side half circuit of the power amplifier; and
supply and grounding circuit structures which provides common mode DC paths for the collector and emitter of the n-side and p-side half circuit to the power source and absolute ground, and balances the n-side and p-side half circuits to provide a radio frequency (RF) virtual ground to the emitter of the n-side half circuit and p-side half circuit; and
first and second capacitors arranged in series and extending between the p-side base of the p-side half circuit and the n-side base of the n-side half circuit, whereby the first and second capacitors are balanced to provide a second RF virtual ground between the first and second capacitors.

10. The antenna system of claim 9, wherein the p-side half circuit comprises:
a first transistor; and
a second transistor arranged in parallel with the first transistor.

11. The antenna system of claim 10, wherein the first transistor and second transistor are heterojunction bipolar transistors.

12. The antenna system of claim 9, wherein the grounding circuit structure comprises:
a first resistor arranged in parallel between the emitter of the n-side half circuit of the power amplifier and the emitter of the p-side half circuit of the power amplifier;
a first inductor arranged in parallel with a second resistor, the first inductor and second resistor connected to the emitter of the n-side half circuit of the power amplifier and absolute ground; and
a second inductor arranged in parallel with a third resistor, the second inductor and third resistor connected to the emitter of the p-side half circuit of the power amplifier and absolute ground.

13. The antenna system of claim 12, wherein the first and second inductors provide the emitter of the p-side half circuit and the emitter of the n-side half circuit at least one of the common mode DC paths to absolute ground.

14. The antenna system of claim 9, wherein the n-side biasing circuit variably tunes the biasing signal applied to the n-side half circuit.

15. An antenna system, comprising:
a differential antenna;
a differential power amplifier communicably coupled to the differential antenna, the differential power amplifier providing an amplified differential output signal to the differential antenna, the amplified differential output signal corresponding to a differential input signal, the differential power amplifier comprising:
a p-side half circuit having a p-side base configured to receive an in-phase signal of the differential input signal;
an n-side half circuit having an n-side base configured to receive an out-of-phase signal of the differential input signal;
a p-side biasing circuit configured to provide a controllable p-side biasing signal to the p-side base;
an n-side biasing circuit configured to provide a controllable n-side biasing signal to the n-side base, whereby the n-side biasing circuit and p-side biasing circuit operate independently of one another;
a power source configured to apply a positive direct current (DC) voltage to a collector of the n-side half circuit and a collector of the p-side half circuit of the power amplifier; and
supply and grounding circuit structures which provides common mode DC paths for the collector and emitter of the n-side and p-side half circuit to the power source and absolute ground, and balances the n-side and p-side half circuits to provide a radio frequency (RF) virtual ground to the emitter of the n-side half circuit and p-side half circuit; and
a negative RF feedback circuit comprising a resistor in series with an inductor, the negative RF feedback circuit positioned between the collector of the p-side half circuit and the p-side base of the p-side half circuit.

16. The antenna system of claim 15, wherein the supply and grounding circuit structures comprise:
a first resistor arranged in parallel between an emitter of the n-side half circuit of the power amplifier and an emitter of the p-side half circuit of the power amplifier;
a first inductor arranged in parallel with a second resistor, the first inductor and second resistor connected to the emitter of the n-side half circuit of the power amplifier and absolute ground; and
a second inductor arranged in parallel with a third resistor, the second inductor and third resistor connected to the emitter of the p-side half circuit of the power amplifier and absolute ground.

17. The antenna system of claim 16, wherein the first and second inductor provide the emitter of the p-side half circuit and the emitter of the n-side half circuit at least one of the common mode DC paths to absolute ground.

18. The antenna system of claim 15, further comprising:
first and second capacitors arranged in series and extending between the p-side base of the p-side half circuit and the n-side base of the n-side half circuit, whereby the first and second capacitors are balanced to provide a second RF virtual ground between the first and second capacitors.

19. The antenna system of claim 18, further comprising:
common mode feedback connected between the first and second capacitors and absolute ground.

20. An antenna system, comprising:
a differential antenna;
a differential power amplifier communicably coupled to the differential antenna, the differential power amplifier providing an amplified differential output signal to the differential antenna, the amplified differential output signal corresponding to a differential input signal, the differential power amplifier comprising:
a p-side half circuit having a p-side base configured to receive an in-phase signal of the differential input signal;
an n-side half circuit having an n-side base configured to receive an out-of-phase signal of the differential input signal;
a p-side biasing circuit configured to provide a controllable p-side biasing signal to the p-side base;
an n-side biasing circuit configured to provide a controllable n-side biasing signal to the n-side base, whereby the n-side biasing circuit and p-side biasing circuit operate independently of one another;
a power source configured to apply a positive direct current (DC) voltage to a collector of the n-side half circuit and a collector of the p-side half circuit of the power amplifier;
supply and grounding circuit structures which provides common mode DC paths for the collector and emitter of the n-side and p-side half circuit to the power source and absolute ground, and balances the n-side and p-side half circuits to provide a radio frequency (RF) virtual ground to the emitter of the n-side half circuit and p-side half circuit; and
first and second capacitors arranged in series and extending between the p-side base of the p-side half circuit and the n-side base of the n-side half circuit, whereby the first and second capacitors are balanced to provide a second RF virtual ground between the first and second capacitors.

\* \* \* \* \*